United States Patent
Rhee

[11] Patent Number: 5,805,715
[45] Date of Patent: Sep. 8, 1998

[54] METHOD AND APPARATUS FOR COMPENSATING MULTI-RESOLUTION LINEAR DISTORTION

[75] Inventor: Won-woo Rhee, Seoul, Rep. of Korea

[73] Assignee: Samsung Electronics Co., Ltd., Kyungki-do, Rep. of Korea

[21] Appl. No.: 267,498

[22] Filed: Jun. 29, 1994

[30] Foreign Application Priority Data

Jun. 29, 1993 [KR] Rep. of Korea ............... 1993 11992

[51] Int. Cl.⁶ .................................................. H04B 1/12
[52] U.S. Cl. ......................... 381/98; 381/103; 381/106
[58] Field of Search .................................. 381/111, 101, 381/98, 103, 106, 108

[56] References Cited

U.S. PATENT DOCUMENTS

| | | | |
|---|---|---|---|
| 4,272,648 | 6/1981 | Agrawal | 381/108 |
| 4,888,808 | 12/1989 | Ishikawa | 381/103 |
| 5,418,859 | 5/1995 | Cho | 381/98 |

Primary Examiner—Minsun Oh Harvey
Attorney, Agent, or Firm—Sughrue, Mion, Zinn, Macpeak & Seas, PLLC

[57] ABSTRACT

A distortion compensation apparatus heightens resolution of a low frequency domain among the audible frequency band, and relatively lowers the resolution in the higher frequency domain. By performing the band division using a Bark scale, filter coefficients are determined. The acoustic signal of the entire audible frequency band which does not pass a low-pass filter is distortion-compensated by a first filter portion. The acoustic signal of the divided band, which is obtained by passing the low-pass filter, is filtered so as to remove a portion of the distortion which is not compensated by signal distortion compensation of the entire audible frequency band by means of a second filter portion. Then, the filtered signal is added to the distortion-compensated acoustic signal of the entire audible frequency band. The remaining signal distortion portion in the distortion compensated acoustic signal by the first filter portion is removed by the signal output from the second filter. Thus, the number of the taps can be reduced and the distortion of the acoustic signal which human cannot recognize with his ear can be compensated.

26 Claims, 6 Drawing Sheets

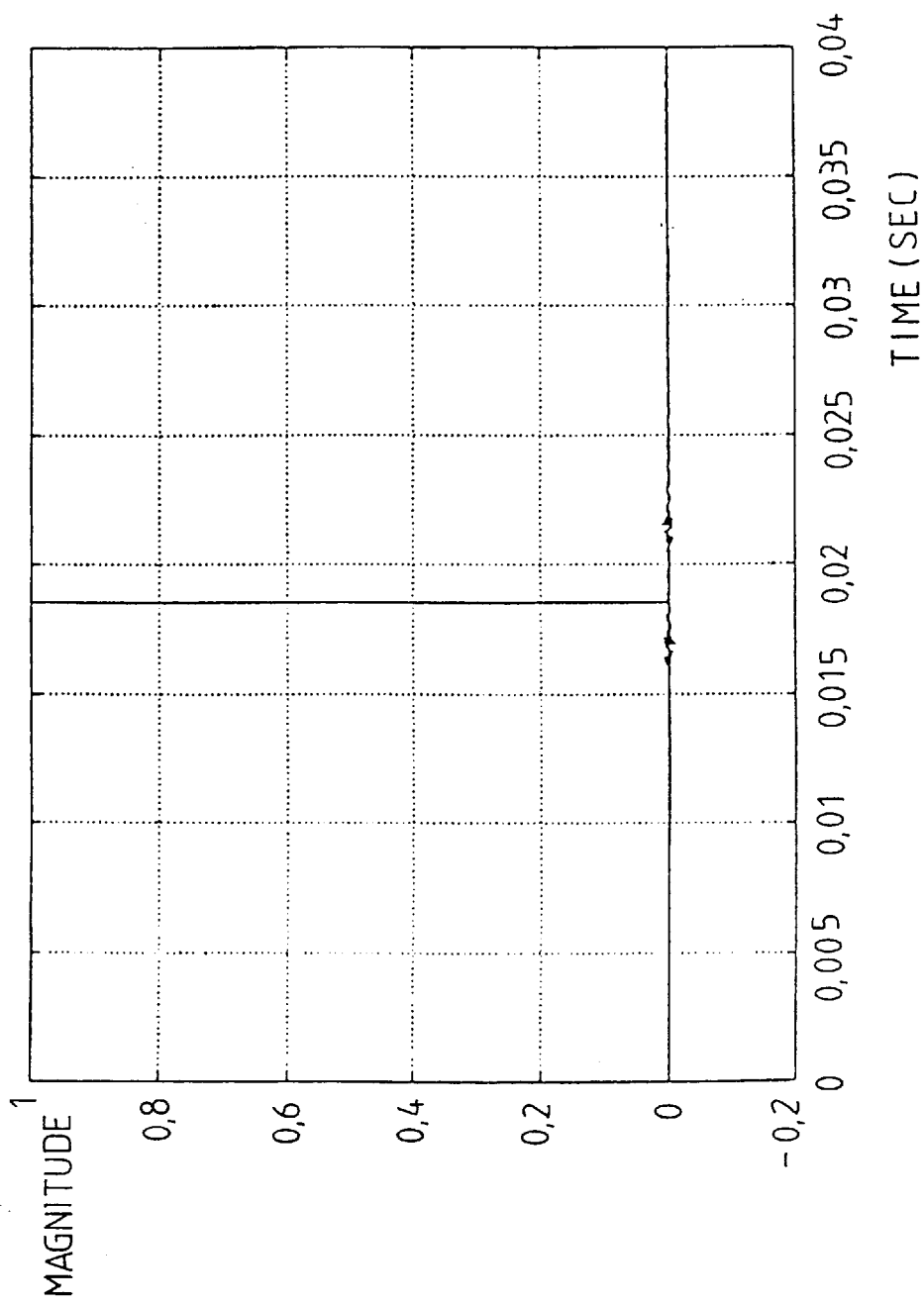

METHOD AND APPARATUS FOR COMPENSATING MULTI-RESOLUTION LINEAR DISTORTION

BACKGROUND OF THE INVENTION

The present invention relates to a distortion compensation method and apparatus for use in a speaker, and more particularly, to a method for compensating a linear distortion of an acoustic signal generated in a speaker system in consideration of human audio characteristic, and the apparatus thereof.

Disclosed is a method for performing band-division of an audible frequency band by using a Bark scale to be explained later, in both the present invention and Korean Patent Application No. 92-15114 filed on Aug. 22, 1992 in Korea. However, the above Korean Patent Application uses band-pass filters for frequency band division, while the present invention uses low-pass filters to divide the audible frequency band into a plurality of sub-bands and performs a linear distortion compensation with respect to the respective sub-bands.

Generally, a sound timbre relies on the linear distortion in a speaker system. In case of an ideal speaker system, a sound pressure/frequency characteristic is shown as being flat. However, if an acoustic signal is distorted due to various causes, a sound pressure/frequency characteristic is distorted and the sound timbre becomes varied.

U.S. Pat. No. 4,888,811 to Takasi, et al. issued on Dec. 19 represents prior art for compensating distortion generated in a speaker system and obtaining a flat sound pressure/frequency characteristic. This reference patent discloses a technology for compensating distortion which is created in an amplitude/frequency characteristic and a phase/frequency characteristic. The input acoustic signal is band-divided into a high-band frequency, an intermediate frequency and a low-band frequency. Also, a flat sound pressure/frequency characteristic and a linear phase/frequency characteristic are assigned according to impulse response coefficients which are determined by sound pressure/frequency characteristic information and phase/frequency characteristic information. U.S. Pat. No. 4,888,808 to Ishikawa et al., issued on Dec. 19, 1989, represents another prior art reference for compensating the distortion in the speaker system. The Ishikawa et al. reference discloses a technology for compensating a phase and an amplitude of a digital acoustic signal which passes through a finite impulse response (FIR) filter based on an independently established amplitude/frequency characteristic and phase/frequency characteristic. In particular, the Ishikawa et al. reference discloses a technology for using filtering coefficients which are calculated with respect to a number of band-pass filters to filter an acoustic signal.

The above-described prior art technologies assigns a frequency domain to be compensated with a certain frequency resolution. By the way, when a certain resolution is assigned to the whole domains to be compensated, and when the number of the taps of the filter is increased to perform a linear distortion compensation in a frequency domain, the number of the taps of the filter for performing a linear distortion compensation in a frequency domain is increased.

A prior art technology which performs a signal equalization only with respect to a low frequency domain or an intermediate frequency domain is disclosed in an International Laid-open Publication No. WO 90/00 851 to Nelson et al. published on Jan. 25, 1990. According to the above publication, an acoustic signal in a low-band or an intermediate acoustic frequency band is signal-equalized and is added to a signal of the whole acoustic frequency band. Then, only a signal which has passed through a low-pass filter is equalized according to a difference between a signal reproduced by a speaker and the signal which has passed through the low-pass filter. Thus, the number of taps of the filter for compensating signal distortion can be decreased. Further, the optimum crosstalk suppression and equalization with respect to the listening place can be obtained.

SUMMARY OF THE INVENTION

Therefore, to solve the above problems, it is an object of the present invention to provide a method for compensating distortion of an acoustic signal so as to match to an auditory characteristic of a human, as well as to reduce the number of filter taps, by establishing a frequency resolution of a filter with respect to a frequency domain which the human feels sensitively according to his auditory characteristic to be higher than that of a filter with respect to a frequency domain which the human feels relatively insensitively.

Another object of the present invention is to provide an apparatus for embodying the above method.

To accomplish the above object of the present invention, there is provided a linear distortion compensation method for compensating distortion of an acoustic signal generated in a speaker system, the linear distortion compensation method comprising the steps of:

establishing frequency resolutions of an audible frequency band and at least one sub-band having the maximum frequency smaller than that of the audible frequency band, so as to be different from each other, using a relationship between a Bark scale and a frequency scale according to an auditory resolution of human; first-filtering for compensating signal distortion created in the acoustic signal of the audible frequency band based on a first frequency resolution corresponding to the audible frequency band;

second-filtering for compensating signal distortion created in the acoustic signal of a first sub-band based on a second frequency resolution corresponding to the first sub-band; and adding the acoustic signals which are filtered by the first- and second-filtering steps.

Another object of the present invention can be accomplished by providing a linear distortion compensation apparatus for compensating distortion of an acoustic signal generated in a speaker system, the linear distortion compensation apparatus comprising:

first filter means which receives the acoustic signal of an audible frequency band and compensates distortion of the acoustic signal based on a predetermined frequency resolution; second filter means which receives the acoustic signal of the audible frequency band, extracts the acoustic signal of a first sub-band having the maximum frequency smaller than that of the audible frequency band from the received acoustic signal, and compensates distortion of the acoustic signal of the first sub-band based on a second frequency resolution higher than the first frequency resolution; and adder means for adding the acoustic signals which are filtered by the first- and second-filter means.

The distortion compensation apparatus according to the present invention heightens resolution of a low frequency domain among the audible frequency band and relatively lowers resolution of a high frequency domain. To heighten resolution of a low frequency domain, the low-pass filters band-divides the whole audible frequency band. The acoustic signals of the whole audible frequency band which does not pass through the low-pass filters are distortion-compensated by a first filter portion. The acoustic signals of the divided bands which are obtained by passing through the low-pass filter are filtered by a second filter portion, so that a distorted portion which is not compensated during the signal distortion compensation of the whole audible frequency band can be removed. Then, the filtered signal is added to the acoustic signal which has been distortion-compensated in the whole audible frequency band. In other words, the signal obtained from the second filter portion is subtracted from the distortion-compensated signal of the whole audible frequency band. Thus, the remaining signal distorted portion is removed by the signal output from the second filter portion from the acoustic signal distortion-compensated by the first filter portion. The characteristics and the number of the filters playing the same role of that of the second filter portion are properly adjusted by a degree of the signal distortion compensation of the acoustic signal output from the first filter portion and the auditory capability of the human.

DETAILED DESCRIPTION OF THE PREFERRED EMBODIMENT

A preferred embodiment of the present invention is described below in more detail with reference to the accompanying drawings.

Figure 1A:
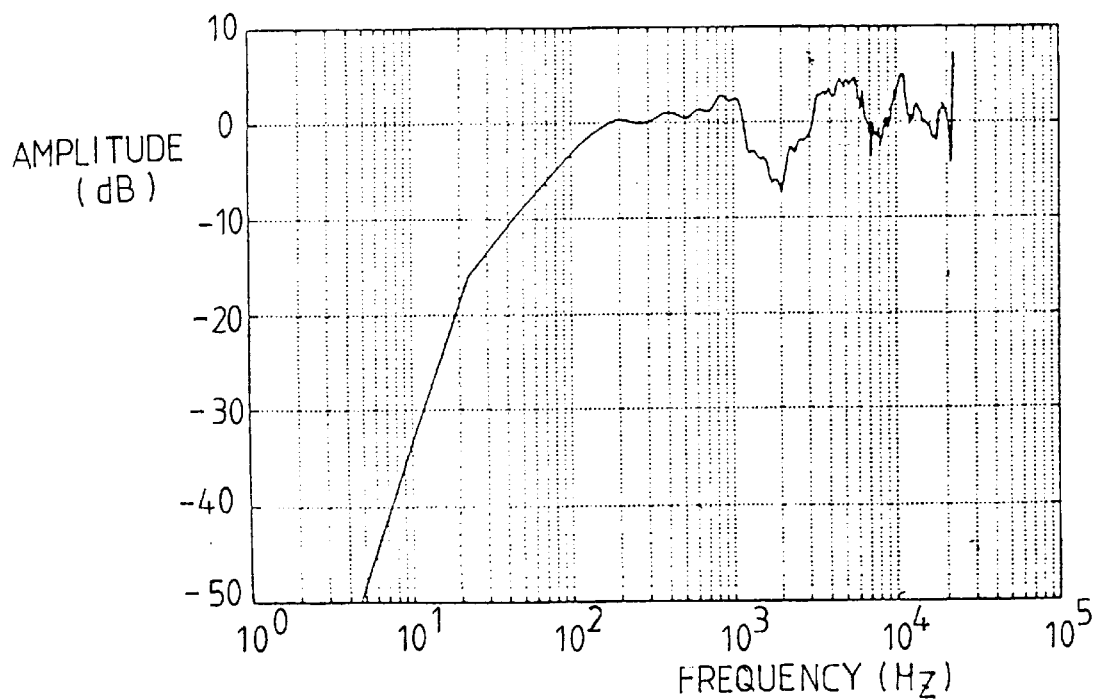
FIG. 1 is characteristic diagrams showing distortion created in a speaker system.
Figure 1B:
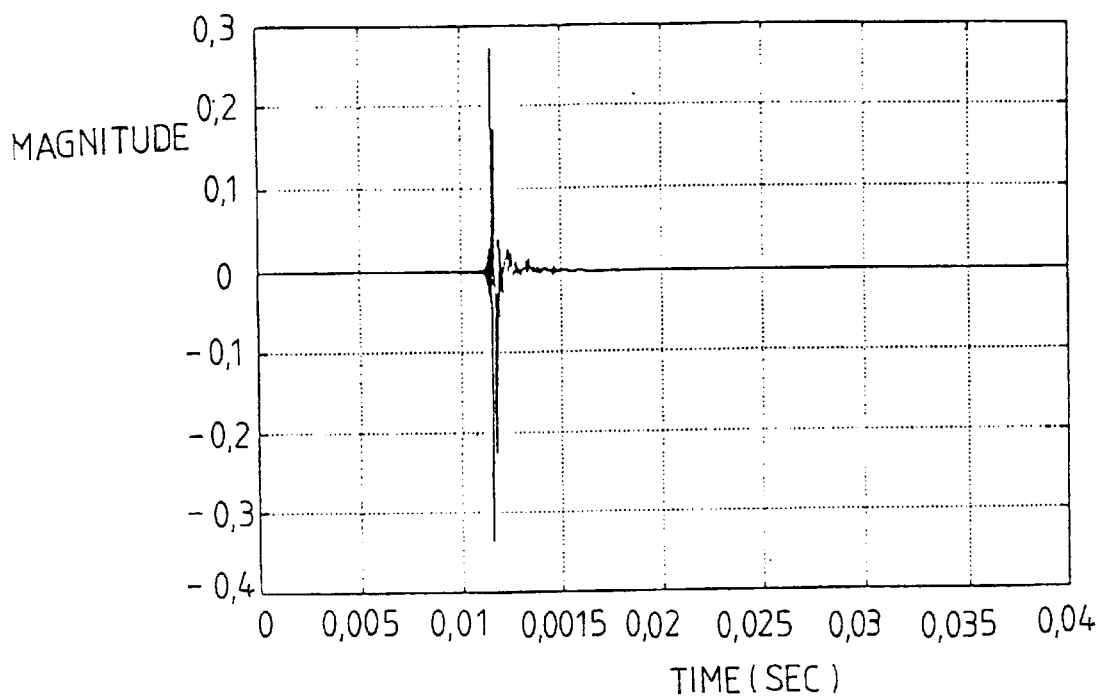

FIGS. 1A and 1B are characteristic diagrams showing the distortion created in the speaker system. FIG. 1A shows a a sound pressure/frequency characteristic when distortion has been created. FIG. 1B shows an impulse response characteristic when distortion has been created. Most of the acoustic equipment converts an electrical signal into an acoustic signal due to a mechanical vibration. In this process, the signal is distorted by a transfer function of the system. In this invention, a multi-resolution linear distortion compensation method and apparatus for compensating such distortion are set forth.

Generally, a cochlea corresponding to an internal ear analyzes a frequency of sound. Since such a snail shaped unit has a different resonent frequency according to the position inside it, the respective positions in the snail unit correspond to specific frequencies. Also, the frequency scale of the cochlea is not linear and has a characteristic of an exponential function. That is, when a sound analysis system of the human is regarded as a filter bank having an identical frequency resolution, the frequency band of the respective filters constituting the filter bank has a shape of constant-Q in which the higher the central frequency may be, the larger the bandwidth may be. Thus, the human more easily senses the frequency change of and acoustic signal in a lower frequency, while it is difficult to sense a frequency change in a higher frequency. In the present invention, by using such an auditory characteristic of the human, the distortion of the acoustic signal generated in the speaker system is compensated by higher frequency resolution in a lower frequency band, and relatively lower frequency resolution in a higher frequency band. Such a multi-resolution linear distortion compensation method of the present invention utilizes a Bark scale, to be described referring to FIGS. 2A and 2B, to form a frequency band which provides frequency resolution higher than that of the audible frequency band.

Figure 2B:
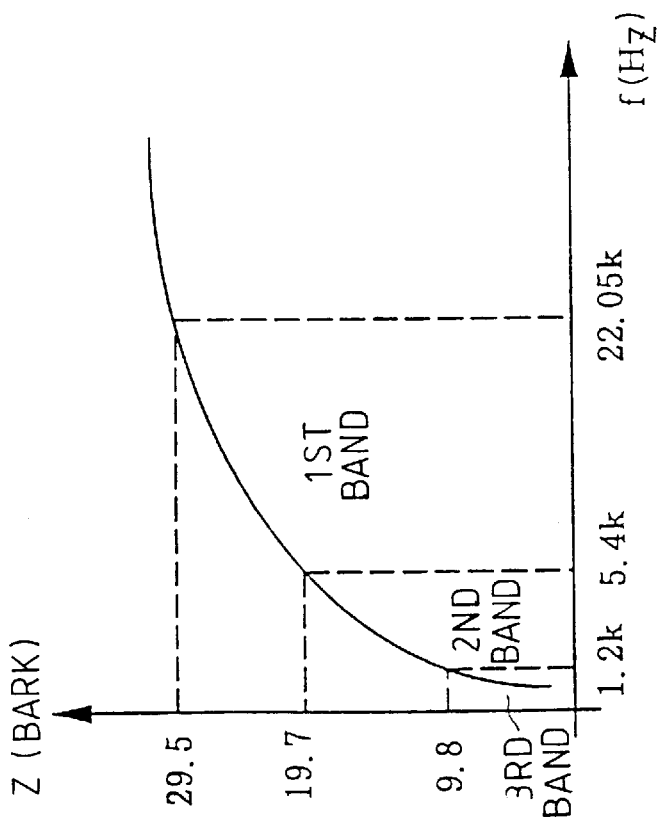
FIG. 2 is characteristic diagrams showing relationships between a Bark scale and a linear frequency scale used in band division according to the present invention.
Figure 2A:
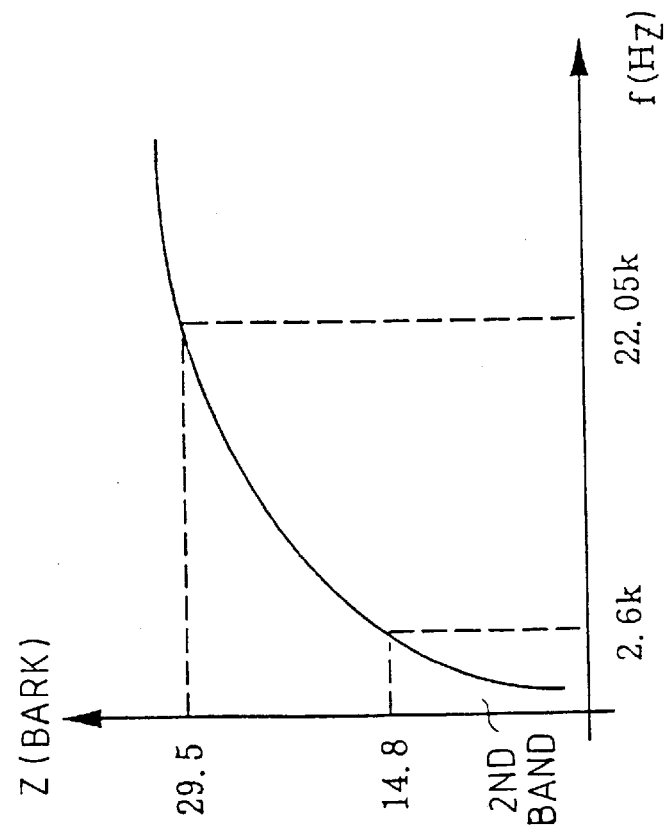

FIGS. 2A and 2B shows a relationship between a Bark scale and a frequency scale according to the present invention. In FIGS. 2A and 2B, a horizontal axis indicates a frequency scale, and a vertical axis indicates a Bark scale. The auditory resolution of the human is represented as a slope of the curve in the audible frequency band of approximate 20 Hz through 20 KHz as shown in FIGS. 2A or 2B. The non-linear frequency scale due to the auditory characteristic of a human is represented as a linear frequency scale by the following equation (1) which represents a relationship between a variable Z of the Bark scale and a frequency f.

$$Z = 7 \times ln[(f/650) + \{(f/650)^2 + 1\}^{1/2}] \tag{1}$$

In the above equation (1), a Bark value Z has a linear corresponding relationship with respect to a frequency sensing position in the cochlea.

To determine two frequency bands having the frequency resolution different from each other, the Bark scale is divided in equal distances as shown in FIG. 2A in a preferred embodiment. Based on the divided Bark scale, a frequency band corresponding to a Bark value equal to or less than 29.5 is classified as a first band, and a frequency band corresponding to a Bark value equal to or less than 14.8 is classified as a second band. The first band is identical to the audible frequency band. FIG. 2A shows the frequency range with respect to the respective two bands. The number of taps of the FIR filter which is used for signal distortion compensation in the respective bands is determined by the following equation (2) based on the characteristic of the constant-Q.

$$29.5/N_1 = 14.8/N_2 \tag{2}$$

In the above equation (2), $N_1$ is the number of taps of the FIR filter in the first band, and $N_2$ is the number of taps of the FIR filter in the second band. If the number of taps of the filters with respect to the whole audible frequency band is two hundred, the following equation (3) is established between the number of the whole taps and the number of the taps in each band.

$$N_1 + N_2 = 200 \tag{3}$$

Thus, using the above equations (2) and (3), $N_1=133$ and $N_2=67$. When the distortion compensation with respect to the acoustic signal is performed using the FIR filter, the resolution of the compensated frequency is obtained by dividing a sampling frequency by the order of the FIR filter. When the sampling frequency fs is 44.1 KHz, the resolution of the FIR filter is approximately 330 Hz in case of the first band of $N_1=133$. In case of the second band, the data which is sampled with a 44.1 KHz sampling frequency which is decimated by seven to one, thereby obtaining a sampling frequency of 6.3 KHz. The frequency resolution with respect to the 6.3 KHz sampling frequency and $N_2=67$ becomes approximately 90 Hz. As described above, after decimating the acoustic signal of the second band, and then FIR-filtering the decimated signal, the frequency resolution with respect to the acoustic signal in the second band is improved by the one to seven interpolation. As a result, since the low frequency band in the audible frequency band can be filtered in the high frequency resolution, even a small number of filter taps can efficiently compensate for the signal distortion.

Next, signal distortion compensation with respect to each band is described when the audible frequency band is divided in to three bands different from each other.

To divide the audible frequency band into three bands, if the Bark scale is equally divided, a frequency band between 20 Hz and 22.0 KHz is classified as a first band, a frequency band between 20 Hz and 5.4 KHz is classified as a second band, and a frequency band between 20 Hz and 1.2 KHz is classified as a third band. When the number of taps of the filter with respect to the whole audible frequency is two hundred, the frequency resolution of the FIR filter with respect to each band is calculated by the following equations (4) and (5) according to the characteristic of the constant-Q.

$$29.5/N_1 = 19.7/N_2 = 9.8/N_3 \tag{4}$$

$$N_1 + N_2 + N_3 = 200 \tag{5}$$

The number of taps and the resolution with respect to three bands is calculated in a method similar to that of the case of classifying the audible frequency band into two different bands, of which the result is shown in the following Table 1.

TABLE 1

|  | Boundary Frequency | Boundary Bark Value | The No. of FIR Flter Taps | FIR FIlter Frequency Resolution |
|---|---|---|---|---|
| 1st Band | 22.05 KHz | 29.5 | 98 | 450 Hz |
| 2nd Band | 5.4 KHz | 19.7 | 68 | 200 Hz |
| 3rd Band | 1.2 KHz | 9.8 | 34 | 90 Hz |

Since the boundary values on the Bark scale used for band division do not limit the present invention, domains having a frequency resolution higher than that of the audible frequency band can be established using other Bark values, and FIR filtering with respect to the respective domains is possible within the scope of the present invention.

A substantial apparatus for compensating signal distortion with respect to bands having the frequency resolution different from each other is described below with reference to FIG. 3.

Figure 3:
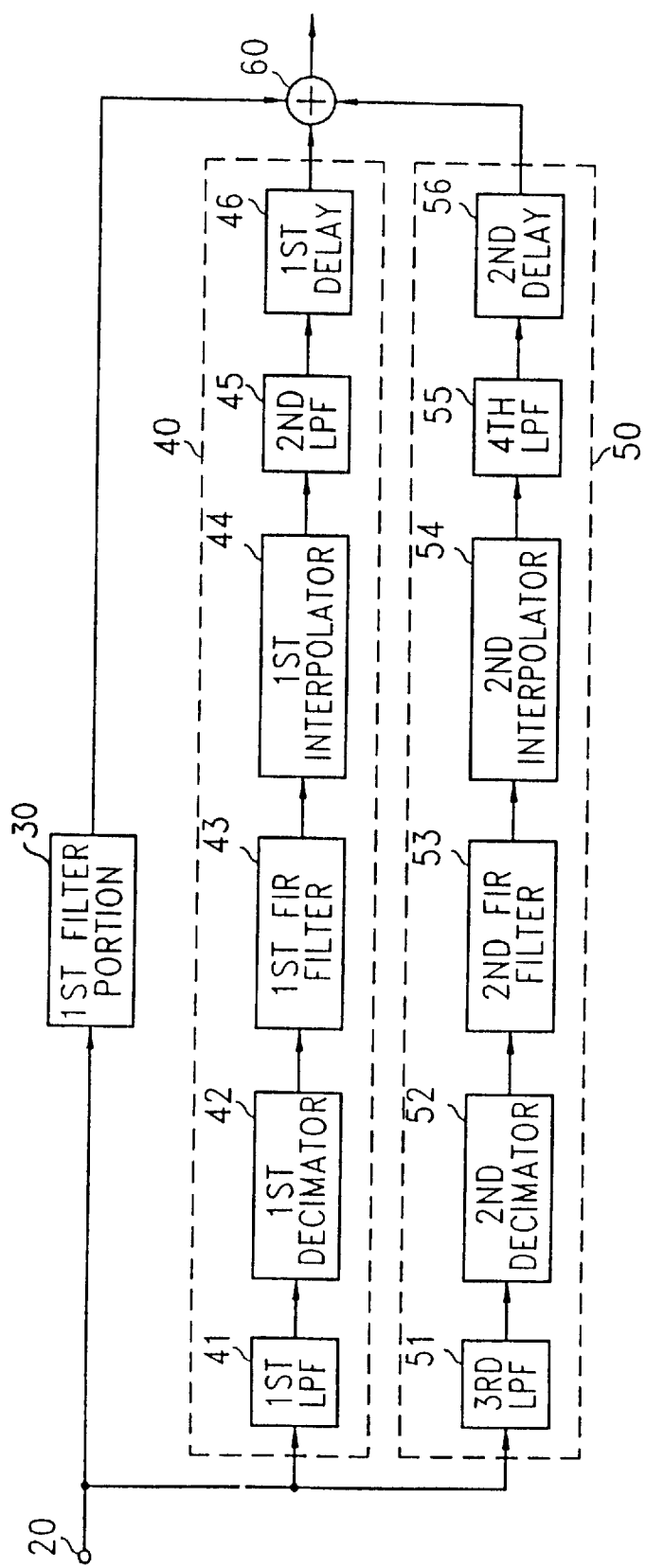
FIG. 3 is a block diagram of a linear distortion compensation apparatus according to a preferred embodiment of the present invention.

FIG. 3 is a block diagram of a linear distortion compensation apparatus according to a preferred embodiment of the present invention. In FIG. 3, a first filter portion 30, a second filter portion 40 and a third filter portion 50 for performing distortion compensation of the acoustic signals which are included in the respective bands of FIG. 2B, are connected in parallel to each other between an acoustic signal input end 20 and an adder 60. Adder 60 adds the signals which are supplied from the respective filter portions 30, 40 and 50.

First filter portion 30 compensates for distortion included in the acoustic signal of the first band. Second filter portion 40 and third filter portion 50 compensate for distortion of the acoustic signals included in the second band and the third band, respectively. The respective filter portions 30, 40 and 50 include FIR filters having the number of taps shown in Table 1, respectively. First filter portion 30 includes a FIR filter for equalizing the acoustic signal of the audible frequency band. Second filter portion 40 includes a first low-pass filter 41 and a second low-pass filter 45 for passing the acoustic signal equal to or less than 5.4 KHz. The output of first low-pass filter 41 is input to a first decimator 42 for decimating the input by 3 to 1. A first FIR filter 43 receives the output of first decimator 42, equalizes the received signal and outputs the equalized signal to a first interpolator 44. First interpolator 44 restores the acoustic signal which is decimated by 3 to 1 into an original signal. Second low-pass filter 45 removes the noise included in the output of first interpolator 44. A first delay 46 delays the output of second low-pass filter 45 so as to be synchronized with the output of first filter portion 30.

Third filter portion 50 includes a third low-pass filter 51, a second decimator 52, a second FIR filter 53, a second interpolator 54, a fourth low-pass filter 55 and a second delay 56, similar to those of second filter portion 40. Third low-pass filter 51 outputs the acoustic signal having a frequency which is equal to or less than 1.32 KHz. Second decimator 52 and second interpolator 54 are used for the decimation of 15 to 1 and the interpolation of 1 to 15.

Prior to explaining the operation for the FIG. 3 apparatus, a procedure of obtaining a filter coefficient with respect to the FIR filter of first filter portion 30 is described. Assuming that the impulse response of the speaker system is S(n), a value of S(n) which is measured in a non-sound room is represented by the following equation (6).

$$S(n) = \sum_{K=1}^{N} S(k-n)S(k) \tag{6}$$

The frequency response of the speaker system is obtained by discrete-Fourier-transforming impulse response S(n).

$$S(\omega_k) = \sum_{n=1}^{N} S(n) \exp\left[-j\frac{2\pi}{N} nk\right] \tag{7}$$

The frequency response with respect to an inverse system of the speaker system having the frequency response which is represented by equation (7) is represented by the following equation (8).

$$F_1(\omega_k) = \begin{cases} \frac{1}{S(\omega_k)}, & \omega_k \geq 20\text{Hz} \\ 0, & \omega_k < 20\text{Hz} \end{cases} \tag{8}$$

Here, the reason why a value of equation 8, in the case of w; $w_k < 20$ Hz should be set to zero is for preventing the speaker from being damaged due to excessive boost in the low frequency domain. First filter portion 30 is comprised of a FIR filter having a frequency response characteristic which is represented by the above equation (8). First filter portion 30 compensates the distortion produced by the speaker system with respect to the entire audible frequency band. To determine the filter coefficients of first filter portion 30, the values with respect to the taps of $N_1$ (=98) which are assigned in the first band of FIG. 2B are selected to be equal distances within a range of 0 to 44.1 KHz and are inverse-discrete-Fourier-transformed. As a result, the $N_1$ coefficients obtained are used as the filter coefficients of first filter portion 30. Thus, the acoustic signal having the frequency of the first band is distortion-compensated by first filter portion 30, having the filter coefficients which are calculated using the above-described method.

However, to perfectly compensate the distortion of the acoustic signal using first filter portion 30, a FIR filter of an infinite order is needed in first filter portion 30. That is, the perfect distortion compensation is not accomplished by first filter portion 30 having limited filter coefficients. Thus, second filter portion 40 is used for compensating the signal distortion which is not compensated in first filter portion 30.

Second filter portion 40 is constructed to have a frequency response $F_2(\omega)$ which is determined by the following equation (9), in order to compensate for the distortion which is not compensated in first filter portion 30.

$$S(\omega)F_2(\omega) = -E_1(\omega) \qquad (9)$$

The relationship between the frequency response $F_2(\omega)$ of second filter portion 40, the frequency response $F_2'(\omega)$ of first FIR filter 43 and the transfer functions of low-pass filters 41 and 45 is represented by the following equation (10).

$$F_2(\omega) = -E_1(\omega)/S(\omega) = F_2'(\omega) L_2^2(\omega) \qquad (10)$$

Here, $F_2'(\omega)$ represents a frequency response from which the influence of the low-pass filter is removed, and $L_2(\omega)$ represents a transfer function of the low-pass filter. The frequency response $F_2'(\omega)$ of first FIR filter 43 is determined by the following equation (11).

$$F_2'(\omega) = \begin{cases} -\dfrac{E_1(\omega)}{S(\omega)L_2^2(\omega)}, & \text{when } 20 \leq \omega \leq 5.4 \text{ KHz} \\ 0, & \text{when the others} \end{cases} \qquad (11)$$

In this embodiment, first FIR filter 43 of second filter portion 40 is constructed to process a signal having a sampling frequency of 14.7 KHz. First low-pass filter 41 receives the acoustic signal of the audible frequency band, prevents any aliasing, and outputs only an acoustic signal having a frequency which is equal to or less than 5.4 KHz to first decimator 42. First decimator 42 decimates the acoustic signal supplied from first low-pass filter 41 by 3 to 1, to thereby lower the sampling frequency down to 14.7 KHz (=44.1 KHz/3). As a result, an acoustic signal having a maximum frequency of 7.35 KHz is obtained. The acoustic signal which is obtained by the decimation is input to first FIR filter 43. First FIR filter 43 filters the acoustic signal according to the filter coefficients which are calculated based on the above equation (11). The $N_2$ filter coefficients of first FIR filter 43 are obtained by selecting equidistant values between 0 and 14.7 and by inverse-discrete-Fourier-transforming the selected frequency values. The filtered acoustic signal is interpolated in first interpolator 44 by a 1 to 3 ratio. Second low-pass filter 45 removes the noise of the filtered acoustic signal. First delay 46 receives the output from second low-pass filter 45, and delays the received signal so as to temporally match the corresponding acoustic signal from first filter portion 30.

Actually, second filter portion 40 also does not perfectly compensate for the error created in first filter portion 30. Thus, third filter portion 50 is used for compensating the errors which are not compensated in first and second filter portions 30 and 40. The present invention is not limited to a fixed number of the filter portions, therefore it is possible within the spirit of the present invention that the audible frequency band is divided into the two bands or another number of bands, to thereby realize the distortion compensation with respect to the respective bands.

Returning again to the description of third filter portion 50 assuming that the frequency response of third filter portion 50 is $F_3(\omega)$, the relationship between impulse response $S(\omega)$, frequency response $F_3(\omega)$ and error $E_2(\omega)$, in the frequency domain is represented by the following equation (12).

$$S(\omega)F_3(\omega) = -E_2(\omega) \qquad (12)$$

Thus, the relationship between the frequency response $F_3(\omega)$ of third filter portion 50, the frequency response $F_3'(\omega)$ of second FIR filter 53 and the transfer functions of low-pass filters 51 and 55 is represented by the following equation (13).

$$F_3(\omega) = -E_2(\omega)/S(\omega) = F_3'(\omega) L_3^2(\omega) \qquad (13)$$

Here, $F_3'(\omega)$ represents a frequency response from which the influence of the low-pass filter is removed, and $L_3(\omega)$ represents a transfer function of the low-pass filter. Thus, the frequency response $F_3'(\omega)$ of second FIR filter 53 is determined by the following equation (14).

$$F_3'(\omega) = \begin{cases} -\dfrac{E_2(\omega)}{S(\omega)L_3^2(\omega)}, & \text{when } 20 \leq \omega \leq 1.2 \text{ KHz} \\ 0, & \text{when the others} \end{cases} \qquad (14)$$

The $N_3$ filter coefficients of second FIR filter 53 are obtained by inverse-discrete-Fourier-transforming the frequency values which are determined by dividing the values between 0 and 2.94 KHz in an equidistant manner. When second FIR filter 53 has the filter coefficents determined as described above, third filter portion 50 processes the signals in a similar way to that of second filter portion 40. At first, third low-pass filter 51 receives the input acoustic signal and outputs only an acoustic signal having the frequency band which is equal to or less than 1.2 KHz to second decimator 52. Second decimator 52 performs a decimation operation of 15 to 1 with respect to the input signal, to thereby generate an acoustic signal having a sampling frequency of 2.94 KHz (=44.11 KHz/15). Second FIR filter 53 receives the signal decimated by 15 to 1 and filters the received signal using the predetermined filter coefficients, to then output the filtered signal to second interpolator 54. Second interpolator 54 interpolates the input signal by a ratio of 1 to 15 and outputs the interpolated signal. Fourth low-pass filter 55 removes the noise generated by the interpolation and outputs the result. Second delay 56 receives the output from fourth low-pass filter 54 and delays the received signal so as to temporally match the corresponding acoustic signal of first filter portion 30, to then output the result.

Adder 60 receives the outputs from respective filter portions 30, 40 and 50 and sums the received signals, to then output the result.

Figure 4A:
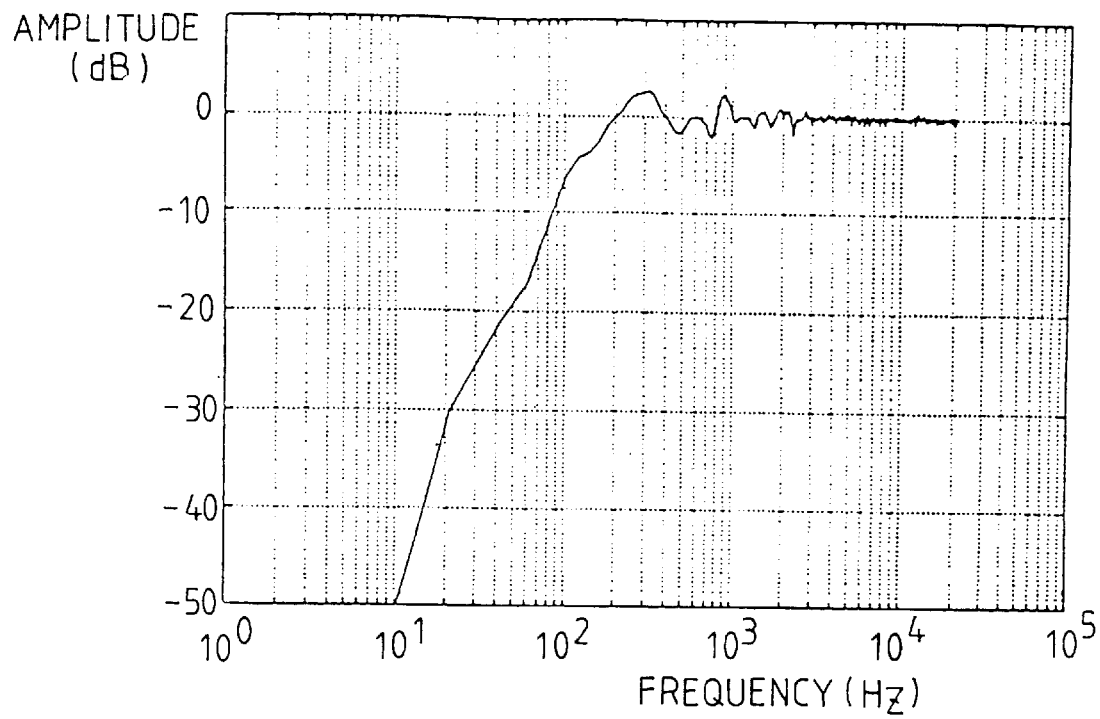
FIG 4 is characteristic diagrams showing the results of compensating for the distortion created in the speaker system.
Figure 4B:
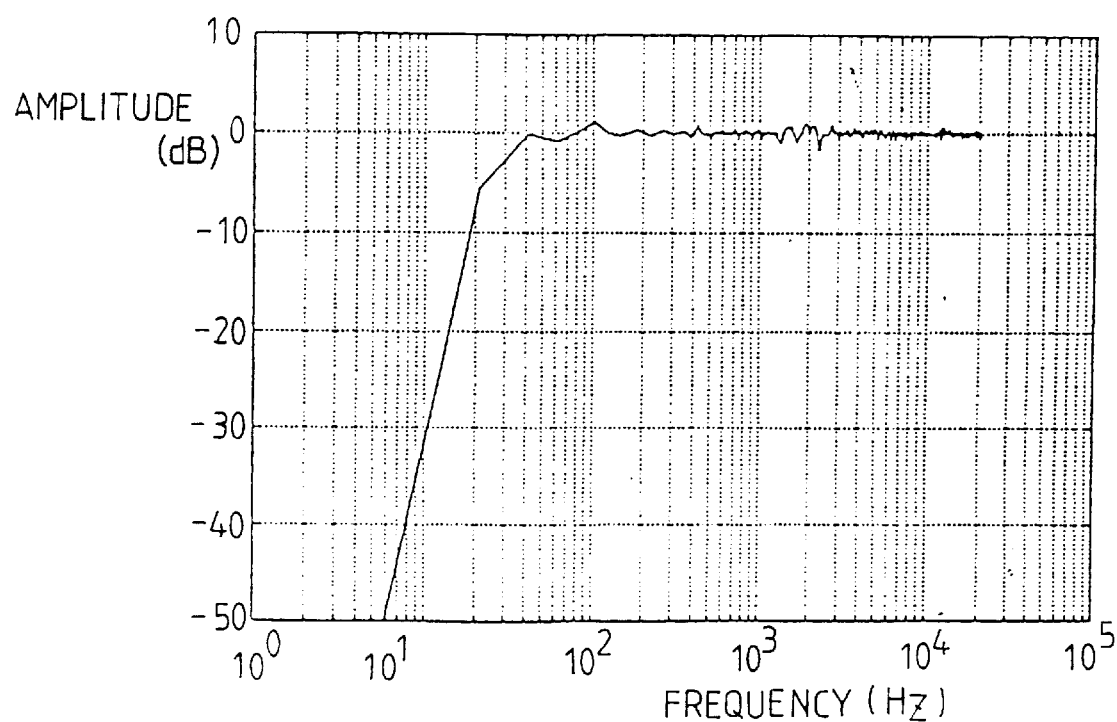
Figure 4D:
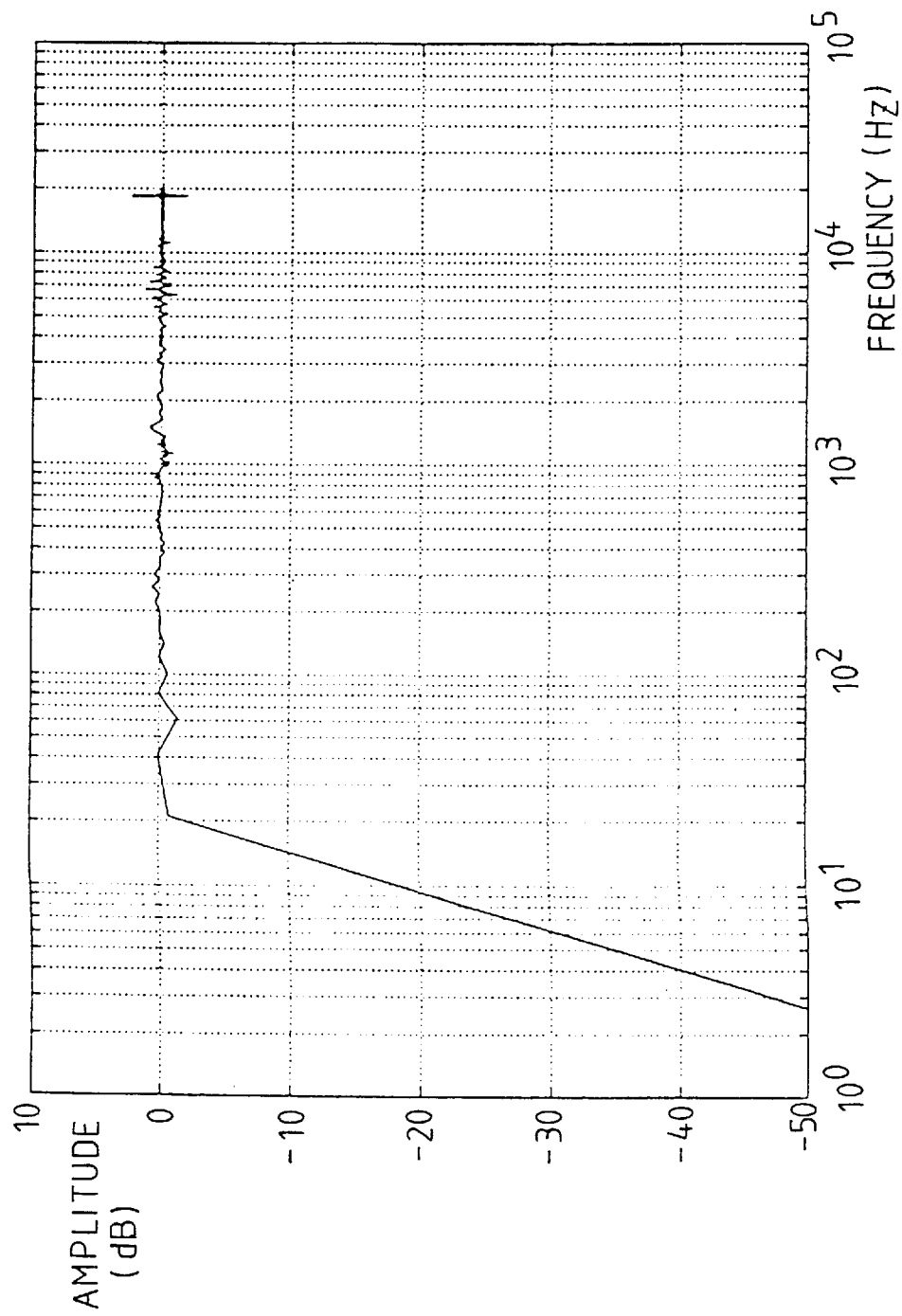

FIGS. 4A through 4D are characteristic diagrams showing the results of compensating the distortion created in the speaker system. FIGS. 4A through 4C show the results of compensating the multi-resolution linear distortion when the audible frequency band is divided into two bands to then process the signal. That is, FIGS. 4A through 4C show characteristic curves when the band division and filter coefficient detemination method using the Bark scale according to the apparatus shown in FIG. 3 are applied to two bands. On the other hand, FIG. 4D shows a result of compensating the distortion using the FIR filter having 1,024 taps according to a method having a certain resolution with respect to the whole bands. FIG. 4A shows a result of compensating the distortion of the acoustic signal using the FIR filter of which the number of the taps is determined using the Bark scale with respect to the entire audible frequency band. As shown in FIG. 4A, a ripple within ±0.5 dB exists in the high frequency band which is equal to or more than 3 KHz. A ripple within ±1 dB exists in the frequency band between 1 KHz and 3 KHz. On the other hand, since a ripple within ±1.5 dB exists in the frequency band which is equal to or less than 1 KHz, such that additional distortion compensation is required. FIG. 4B shows a result of compensating the distortion of the acoustic signal in the frequency band between 0 and 5.2 KHz. In FIG. 4B, the signal distortion compensation is not accomplished with respect to the frequency band which is equal to or more than 5.2 KHz. On the other hand, FIG. 4B shows an excellent amplitude/frequency characteristic having a ripple of ±0.5 dB with respect to a frequency band between 100 Hz, and 5.2 KHz. Actually, an original sound and a reproduced sound cannot be discriminated in ±1 dB or so. FIG. 4C shows an impulse response characteristic which is obtained by compensating the distortion of the speaker with a multi-resolution linear distortion apparatus of the present invention. Compared with the impulse response of FIG. 1B, FIG. 4C shows an improved response characteristic of the distortion compensation. The distortion compensation capability of the multi-resolution distortion compensation apparatus can be more clearly seen from FIG. 4D compared with FIG. 4B. FIG. 4D shows a result of compensating the distortion by the conventional FIR filter having 1,024 taps, while FIG. 4B shows a result of compensating the distortion by the multi-resolution distortion apparatus having only 272 taps.

Since the sampling frequencies of the second filter portion and the third filter portion which are used in one embodiment of the present invention does not limit the scope of the invention, other modifications and variations using FIR filters having other sampling frequencies are possible within the spirit of the present invention.

The distortion compensation apparatus of the present invention determines the filter coefficients by performing band-division using the Bark scale, the number of the taps can be reduced and the distortion of the acoustic signal which the human has difficulty discerning can be compensated.

What is claimed is:

1. A linear distortion compensation apparatus for compensating distortion of an acoustic signal generated in a speaker system, said linear distortion compensation apparatus comprising:

first filter means for receiving the acoustic signal of an audible frequency band, and compensating for distortion of the acoustic signal based on a predetermined first frequency resolution of the audible frequency band, wherein said first filter means filters the acoustic signal over a first band, the first band including the entire audible frequency band of the acoustic signal;

second filter means for receiving the acoustic signal of the audible frequency band, extracting from the received acoustic signal an acoustic signal of a second band of the audible frequency band, the second band having a maximum frequency smaller than that of the audible frequency band, and compensating for distortion of the acoustic signal of the second band based on a second frequency resolution of said second band, wherein said second frequency resolution is higher than said first frequency resolution; and adder means for adding the acoustic signals filtered by said first- and second-filter means.

2. A linear distortion compensation apparatus according to claim 1, wherein each of said first and second filter means determines a frequency value corresponding to a maximum frequency of the first and second bands, respectively, determined by equally dividing a Bark scale, and establishes a filter coefficient according to a frequency resolution for each band.

3. A linear distortion compensation apparatus according to claim 2, wherein said first filter means comprises a FIR filter.

4. A linear distortion compensation apparatus according to claim 3, wherein said second filter means comprises:

a first low-pass filter for extracting the acoustic signal of said second band from the acoustic signal of the audible frequency band;

a first decimator for decimating an output of said first low-pass filter by a first decimation ratio in a frequency domain;

a first FIR filter for filtering the acoustic signal having a sampling frequency lowered by said first decimator according to first FIR filter coefficients calculated based on said second frequency resolution and said first decimation ratio; and a first interpolator for interpolating an output of said first FIR filter according to an inverse ratio of said first decimation ratio, and outputting a first interpolated signal to said adder means.

5. A linear distortion compensation apparatus according to claim 4, wherein said second filter means further comprises a delay means for compensating for a signal delay generated between an output of said first filter means and the output of said first interpolator.

6. A linear distortion compensation apparatus according to claim 4, wherein said second filter means further comprises a second low-pass filter for removing noise from the output of said first interpolator.

7. A linear distortion compensation apparatus according to claim 4, further comprising third filter means for receiving an acoustic signal of a third band of the audible frequency, the third band having a smaller maximum frequency than said second band, compensating for signal distortion based on a third frequency resolution of said third band, wherein the third frequency resolution is higher than said second frequency resolution, and outputting the compensated signal to said adder means.

8. A linear distortion compensation apparatus according to claim 7, wherein said third filter means comprises:

a third low-pass filter for extracting the acoustic signal of said third band from the acoustic signal;

a second decimator for decimating an output of said third low-pass filter by a second decimation ratio larger than said first decimation ratio in a frequency domain;

a second FIR filter for filtering the acoustic signal having a sampling frequency lowered by said second decimator according to second FIR filter coefficients calculated based on said third frequency resolution and said second decimation ratio; and a second interpolator for interpolating the output of said second FIR filter according to an inverse ratio of said second decimation ratio, and outputting a second interpolated signal to said adder means.

9. A linear distortion compensation apparatus according to claim 8, wherein said third filter means further comprises a fourth low-pass filter for removing noise from the second interpolated signal and outputting the result to said adder means.

10. A linear distortion compensation apparatus according to claim 9, wherein said second filter means further comprises a delay means for compensating for a signal delay generated between the output of said first filter means and the output of said second interpolator.

11. A linear distortion compensation method for compensating for distortion of an acoustic signal generated in a speaker system, said linear distortion compensation method comprising the steps of:

establishing frequency resolutions of an audible frequency band and at least one sub-band of the audible frequency band having a maximum frequency smaller than that of the audible frequency band, so as to be different from each other, using a relationship between a Bark scale and a frequency scale according to an auditory resolution of a human;

first-filtering the acoustic signal to compensate for signal distortion created in the acoustic signal of the audible frequency band based on a first frequency resolution corresponding to the audible frequency band;

second-filtering the acoustic signal to compensate for signal distortion created in the acoustic signal of a first sub-band of said at least one sub-band of the audible frequency band based on a second frequency resolution corresponding to said first sub-band; and adding the acoustic signals filtered by said first- and second-filtering steps.

12. A linear distortion compensation method according to claim 11, wherein each of said first- and second-filtering steps further comprise the steps of:

dividing a corresponding frequency band in equidistant bands based on the corresponding frequency resolution;

calculating a FIR filter coefficient corresponding to the respectively divided bands; and equalizing the acoustic signal of the corresponding frequency band based on said calculated filter coefficients.

13. A linear distortion compensation method according to claim 12, wherein said first-filtering step equalizes the acoustic signal of said first sub-band based on said second frequency resolution of said first sub-band higher than said first frequency resolution.

14. A linear distortion compensation method according to claim 13, wherein said second-filtering step further comprises the steps of:

a first low-pass filtering step for extracting an acoustic signal of said first sub-band;

a first decimation step for decimating the output of said first low-pass filtered sub-band by a first decimation ratio to lower the sampling frequency of the signal;

a first FIR filtering step for equalizing the decimated acoustic signal having a lowered sampling frequency, according to filter coefficients which are calculated based on said second frequency resolution and said first decimation ratio; and a first interpolating step for interpolating the FIR filtered signal by an inverse ratio of said first decimation ratio and outputting the result.

15. A linear distortion compensation method according to claim 14, further comprising a third filtering step for compensating signal distortion generated in the acoustic signal which is generated in the acoustic signal of said second sub-band having the maximum frequency lower than said first sub-band.

16. A linear distortion compensation method according to claim 15, wherein said third filtering step equalizes the acoustic signal of said second sub-band based on a third frequency resolution of said second sub-band higher than said second frequency resolution.

17. A linear distortion compensation method according to claim 16, wherein said third filtering step further comprises the steps of:

a third low-pass filtering step for receiving the acoustic signal of the audible frequency band and extracting the acoustic signal of said second sub-band;

a second decimating step for decimating said third low-pass filtered acoustic signal of said second sub-band by a second decimation ratio larger than the first decimation ratio, and lowering the sampling frequency of the acoustic signal;

a second FIR filtering step for equalizing the decimated acoustic signal having a lowered sampling frequency, according to FIR filter coefficients which are calculated based on said third frequency resolution and said second decimation ratio; and a second interpolating step for interpolating the FIR filtered signal by an inverse ratio of said second decimation ratio, and outputting the result.

18. A linear distortion compensation apparatus for compensating distortion of an acoustic signal generated in a speaker system, said linear distortion compensation apparatus comprising:

first filtering means for filtering the acoustic signal compensating for distortion of the acoustic signal based on a predetermined first frequency resolution, wherein said first filtering means filters the acoustic signal over the entire audible frequency band of the acoustic signal;

second filtering means for filtering a sub-band of the acoustic signal based on a second frequency resolution of said sub-band higher than said first frequency resolution, wherein said sub-band is one of one or more sub-bands of the acoustic signal determined by dividing the bandwidth of the acoustic signal according to a human auditory response characteristic; and adding means for adding outputs of each of said filtering means and outputting a distortion compensated acoustic signal.

19. A linear distortion compensation apparatus according to claim 18, wherein each of said filtering means are comprised of FIR filters.

20. A linear distortion compensation apparatus according to claim 18, wherein said sub-bands are determined based on a Bark scale.

21. A linear distortion compensation method for compensating distortion of an acoustic signal generated in a speaker system, said linear distortion compensation method comprising the steps of:

determining one or more frequency sub-bands of the acoustic signal according to a human auditory response characteristic;

filtering the entire bandwidth of the acoustic signal to compensate for distortion of the acoustic signal based on a predetermined first frequency resolution;

filtering each of said sub-bands of the acoustic signal based on a frequency resolution for each of said sub-bands, wherein a maximum frequency of each of said sub-bands is less than a maximum frequency of the acoustic signal, and wherein the frequency resolution for filtering each of said sub-bands is higher than the predetermined first frequency resolution for filtering the entire bandwidth of the acoustic signal; and adding each of said filtered acoustic signals to produce and output a distortion compensated acoustic signal.

22. A linear distortion compensation apparatus according to claim 21, wherein each of said filtering steps is accomplished by employing a FIR filter.

23. A linear distortion compensation apparatus according to claim 21, wherein said sub-bands are determined based on a Bark scale.

24. A linear distortion compensation apparatus according to claim 1, wherein said second band is entirely within said audible frequency band.

25. A linear distortion compensation apparatus according to claim 18, wherein said sub-band of the acoustic signal is entirely within the audible frequency band of said acoustic signal filtered by said first filtering means.

26. A linear distortion compensation method according to claim 21, wherein frequency ranges of said sub-bands of the acoustic signal are within said entire bandwidth of the acoustic signal.

* * * * *